(12) United States Patent
Yan et al.

(10) Patent No.: US 9,081,065 B2
(45) Date of Patent: Jul. 14, 2015

(54) INDUCTANCE MEASURING DEVICE AND METHOD FOR MEASURING AN INDUCTANCE PARAMETER OF PERMANENT MOTOR

(75) Inventors: Feng Yan, Shanghai (CN); Cheng Lu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 546 days.

(21) Appl. No.: 13/559,599

(22) Filed: Jul. 27, 2012

(65) Prior Publication Data

US 2013/0173193 A1 Jul. 4, 2013

(30) Foreign Application Priority Data

Dec. 30, 2011 (CN) .......................... 2011 1 0457049

(51) Int. Cl.
*G06F 19/00* (2011.01)
*G01R 31/34* (2006.01)

(52) U.S. Cl.
CPC ...................................... *G01R 31/34* (2013.01)

(58) Field of Classification Search
CPC ........ H02P 21/0035; H02P 21/00; H02P 6/20
USPC ................................ 702/66, 64, 65, 182–185
See application file for complete search history.

(56) References Cited

U.S. PATENT DOCUMENTS 5,652,495 A * 7/1997 Narazaki et al. .............. 318/716

* cited by examiner

*Primary Examiner* — Edward Raymond
(74) *Attorney, Agent, or Firm* — CKC & Partners Co., Ltd.

(57) ABSTRACT

The present disclosure provides an inductance parameter measuring device of the permanent motor and the method thereof. The method includes: providing a d-axis given current signal and a q-axis given current signal; converting the d-axis given current signal and the q-axis given current signal to a three-phase command signal and outputting a motor control signal corresponding to the three-phase command signal, and obtaining a three-phase feedback signal, from which a d-axis feedback signal and a q-axis feedback signal is generated, based on the motor control signal; calculating a d-axis inductance and a q-axis inductance based on the first, second, third and fourth response signals when the permanent motor is in a stationary state, wherein the first, second, third and fourth response signals are respectively corresponded to the d-axis given current signal, the q-axis given current signal, the d-axis feedback signal and the q-axis feedback signal.

38 Claims, 9 Drawing Sheets

INDUCTANCE MEASURING DEVICE AND METHOD FOR MEASURING AN INDUCTANCE PARAMETER OF PERMANENT MOTOR

RELATED APPLICATIONS

This application claims priority to Chinese Application Serial Number 201110457049.6, filed Dec. 30, 2011, which is herein incorporated by reference.

BACKGROUND

1. Field of Invention

The present disclosure relates to a permanent motor. More particularly, the present disclosure relates to an inductance measuring device and a method for measuring an inductance parameter of the permanent motor.

2. Description of Related Art

Currently, during measuring of an inductance parameter of an AC motor, a current measuring method measures the inductance parameter when the motor is in a stationary state by inputting different voltage or current and locking the motor using a mechanical contracting brake device. However, after the mechanical contracting brake device is incorporated, commonly more measuring space is occupied and the measuring cost is increased, such that the measuring efficiency of the inductance parameter is poor.

Furthermore, another current measuring method obtains a phase inductance through experiments and then indirectly obtains a d-axis inductance and a q-axis inductance through a complex calculation and deduction process. In a common inductance measuring method such as the Dalton inductance measuring method, the measuring circuit is connected to each of three phases A, B, C, and a two-by-two connection (AB, BC or CA) is implemented, such that an alternative current (AC) close to a rated current is inputted into the circuit, and terminal voltage and current corresponding to the circuit with the two-by-two connection are recorded, so as to obtain a three-phase inductance. At this time, the AC is only inputted into arbitrary two of the three phases and the phase left is not energized, such that no magnetic linkage is generated in the two energized phases, thereby naturally forming no mutual inductance between the two phases. In this measuring method, a d-axis inductance and a q-axis inductance can be solved by using the three-phase inductance. However, in this measuring method, in the process of indirectly obtaining each d-axis inductance and each q-axis inductance, the calculation is extremely complex and the error is great, which brings much inconvenience in an actual measuring application.

In view of this, many in the industry are endeavoring to find ways in which to design a novel inductance parameter measuring device and method when the permanent motor is in a stationary state, which does not need any additional auxiliary device such as the mechanical contracting brake device and can provide a simple calculation method which is easy to be operated.

SUMMARY

In order to solve one of the disadvantages of measuring inductance parameters of a permanent motor in the related art, the present disclosure provides a novel inductance measuring device for measuring an inductance parameter of the permanent motor and a method thereof.

According to an embodiment of the present disclosure, an inductance measuring device is provided for measuring the inductance parameters of the permanent motor. The inductance measuring device includes a signal conversion unit, a power conversion unit and a parameter calculation unit. The signal conversion unit converts a signal corresponding to a d-axis given current signal and a signal corresponding to a q-axis given current command signal into a three-phase command signal, and converts a three-phase feedback signal of the permanent motor into a d-axis feedback signal and a q-axis feedback signal. The power conversion unit receives the three-phase command signal and outputting a motor control signal corresponding to the three-phase command signal, so as to obtain the three-phase feedback signal based on the motor control signal. The parameter calculation unit receives a first response signal corresponding to the d-axis given current signal, a second response signal corresponding to the q-axis given current signal, a third response signal corresponding to the d-axis feedback signal and a fourth response signal corresponding to the q-axis feedback signal, and calculates a d-axis inductance and a q-axis inductance based on the first, second, third and fourth response signals when the permanent motor is in a stationary state.

In an embodiment, the power conversion unit includes a voltage source inverter, and the inductance measuring device further includes a control unit. The control unit receives the d-axis given current signal and the q-axis given current signal, and outputs a d-axis voltage command signal corresponding to the d-axis given current signal and a q-axis voltage command signal corresponding to the q-axis given current signal. The signal conversion unit receives and converts the d-axis voltage command signal and the q-axis voltage command signal into the three-phase command signal.

In another embodiment, the three-phase feedback signal, the d-axis feedback signal and the q-axis feedback signal are all current signals.

In an embodiment, the power conversion unit includes a current source inverter, and the three-phase feedback signal, the d-axis feedback signal and the q-axis feedback signal are all voltage signals.

In an embodiment, when a value of the d-axis inductance is calculated, the d-axis given current signal includes a DC (direct current) component and an AC (alternative current) component. In another embodiment, the q-axis given current signal is zero In an embodiment, when a value of the d-axis inductance is calculated, the d-axis given current signal includes a DC component and an AC component. In another embodiment, the q-axis given current signal is zero.

In an embodiment, the first response signal is the d-axis voltage command signal, and the third response signal is the d-axis current feedback signal, such that the d-axis inductance is expressed as below:

$$L_d = \frac{U^*_{d\_AC}}{\omega_d I_{d\_AC}} \sin\varphi \text{ or } L_d = \frac{U^{*2}_{d\_AC}}{\omega_d Q_d} \text{ or } L_d = \frac{Q_d}{\omega_d I^2_{d\_AC}}$$

wherein $U^*_{d\_AC}$ is amplitude of the AC component of the d-axis voltage command signal, $I_{d\_AC}$ is amplitude of the AC component of the d-axis current feedback signal, $\omega_d$ is a frequency of the AC component of the d-axis given current signal, and $\varphi$ is a phase difference between the AC component of the d-axis voltage command signal and the AC component of the d-axis current feedback signal, and $Q_d$ is an reactive power generated at the d-axis inductance by the AC component of the d-axis given current signal and obtained from $$U^*_{d\_AC} * I_{d\_AC} * \sin\varphi.$$

In an embodiment, the first response signal is the d-axis given current signal, and the third response signal is the d-axis voltage feedback signal, such that the d-axis inductance is expressed as below:

$$L_d = \frac{U_{d\_AC}}{\omega_d I^*_{d\_AC}}\sin\varphi \text{ or } L_d = \frac{Q_d}{\omega_d I^{*2}_{d\_AC}} \text{ or } L_d = \frac{U^2_{d\_AC}}{\omega_d Q_d}$$

wherein, $I^*_{d\_AC}$ is amplitude of the AC component of the d-axis given current signal, $U_{d\_AC}$ is amplitude of the AC component of the d-axis voltage feedback signal, $\omega_d$ is a frequency of the AC component of the d-axis given current signal, $\phi$ is a phase difference between the AC component of the d-axis voltage feedback signal and the AC component of the d-axis given current signal, and $Q_d$ is an reactive power generated at the d-axis inductance by the AC component of the d-axis given current signal and obtained from $$U_{d\_AC}*I^*_{d\_AC}*\sin\phi.$$

In an embodiment, when a value of the d-axis inductance is calculated, the d-axis given current signal includes a DC component and an AC component, and when the amplitude of the DC component of the d-axis given current signal is constant and the amplitude of the AC component of the d-axis given current signal changes, different d-axis inductances corresponding to the AC component form a successive d-axis inductance curve.

In another embodiment, when a value of the d-axis inductance is calculated, the d-axis given current signal comprises a DC component and an AC component, and when the amplitude of the DC component of the d-axis given current signal changes, the DC component with different amplitude corresponds to different d-axis inductance curves.

In an embodiment, when a value of the q-axis inductance is calculated, the d-axis given current signal includes a DC component and the q-axis given current signal comprises an AC component.

In an embodiment, the second response signal is the q-axis voltage command signal, and the fourth response signal is the q-axis current feedback signal, such that the q-axis inductance is expressed as below:

$$L_q = \frac{U^*_{q\_AC}}{\omega_q I_{q\_AC}}\sin\varphi \text{ or } L_q = \frac{U^{*2}_{q\_AC}}{\omega_q Q_d} \text{ or } L_q = \frac{Q_q}{\omega_q I^2_{q\_AC}}$$

wherein $U^*_{q\_AC}$ is amplitude of the AC component of the q-axis voltage command signal, $I_{q\_AC}$ is amplitude of the AC component of the q-axis current feedback signal, $\omega_q$ is a frequency of the AC component of the q-axis given current signal, and $\phi$ is a phase difference between the AC component of the q-axis voltage command signal and the AC component of the q-axis current feedback signal, and $Q_q$ is an reactive power generated at the q-axis inductance $L_q$ by the AC component of the q-axis given current signal and obtained from $$U^*_{q\_AC}*I_{q\_AC}*\sin\phi.$$

In an embodiment, the second response signal is the q-axis given current signal, and the fourth response signal is the q-axis voltage feedback signal, such that the q-axis inductance is expressed as below:

$$L_q = \frac{U_{q\_AC}}{\omega_q I^*_{q\_AC}}\sin\varphi \text{ or } L_q = \frac{Q_q}{\omega_q I^{*2}_{q\_AC}} \text{ or } L_q = \frac{U^2_{q\_AC}}{\omega_q Q_q}$$

wherein, $I^*_{q\_AC}$ is the amplitude of the q-axis given current signal, $U_{q\_AC}$ is the amplitude of the q-axis voltage feedback signal, $\omega_q$ is the frequency of the AC component of the q-axis given current signal, $\phi$ is the phase difference between the AC component of the q-axis voltage feedback signal and the AC component of the q-axis given current signal, and $Q_q$ is the reactive power generated at the q-axis inductance by the AC signal and is obtained from the $$U_{q\_AC}*I^*_{q\_AC}*\sin\phi.$$

In an embodiment, when a value of the d-axis inductance is calculated, the d-axis given current signal comprises a DC component and an AC component; and when a value of the q-axis inductance is calculated, the d-axis given current signal comprises a DC component and the q-axis given current signal comprises an AC component, wherein the waveform of the AC component is a sine wave, triangular wave or sawtooth wave.

In an embodiment, when a value of the d-axis inductance is calculated, the d-axis given current signal comprises a DC component and an AC component; and when a value of the q-axis inductance is calculated, the d-axis given current signal comprises a DC component and the q-axis given current signal an AC component, wherein the frequency of the AC component of the d-axis given current signal and/or the q-axis given current signal is 0.5-3 times of the rated frequency of the permanent motor.

In another embodiment, the frequency of the AC component of the d-axis given current signal and/or the q-axis given current signal is equal to the rated frequency of the permanent motor.

In an embodiment, when a value of the q-axis inductance is calculated, the d-axis given current signal includes a DC component and the q-axis given current signal comprises an AC component, and when the amplitude of the DC component of the d-axis given current signal is constant and the amplitude of the AC component of the q-axis given current signal changes, different q-axis inductances corresponding to the AC component with different amplitude form a successive q-axis inductance curve.

In another embodiment, when a value of the q-axis inductance is calculated, the d-axis given current signal includes a DC component and the q-axis given current signal comprises an AC component, and when the amplitude of the DC component of the d-axis given current signal changes, the DC component with different amplitude corresponds to different q-axis inductance curves.

In a further embodiment, the control unit also receives the d-axis current feedback signal and generates the d-axis voltage command signal according to the d-axis given current signal and the d-axis current feedback signal; or receives the q-axis current feedback signal and generating the q-axis voltage command signal according to the q-axis given current signal and the q-axis current feedback signal.

In still a further embodiment, the control unit also includes: a comparator used for receiving and then comparing the d-axis given current signal and the d-axis current feedback signal so as to output a comparison signal; and an adjuster used for receiving the comparison signal and generating the d-axis voltage command signal according to the comparison signal.

In still yet a further embodiment, the control unit also includes: a comparator used for receiving and then comparing the q-axis given current signal and the q-axis current feedback signal so as to output a comparison signal; and an adjuster used for receiving the comparison signal and generating the q-axis voltage command signal according to the comparison signal.

According to a further embodiment of the present disclosure, a method for measuring inductance parameters of a permanent motor is provided. First, a d-axis given current signal and a q-axis given current signal are provided. Subsequently, the d-axis given current signal and the q-axis given current signal are received and converted to a three-phase command signal by a first coordinate transformation. Afterwards, the three-phase command signal is received and a motor control signal corresponding to the three-phase command signal is outputted by using a power conversion unit, and a three-phase feedback signal is obtained based on the motor control signal, such that a d-axis feedback signal and a q-axis feedback signal are generated from the three-phase feedback signal of the permanent motor by a second coordinate transformation. Finally, a d-axis inductance and a q-axis inductance are calculated based on first, second, third and fourth response signals when the permanent motor is in a stationary state, wherein the first response signal is the d-axis given current signal, the second response signal is the q-axis given current signal, the third response signal is the d-axis feedback signal and the fourth response signal is the q-axis feedback signal.

In an embodiment, when the power conversion unit includes a voltage source inverter (VSI), the step of receiving and converting the d-axis given current signal and the q-axis given current signal to the three-phase command signal by the first coordinate transformation further includes: generating a d-axis voltage command signal corresponding to the d-axis given current signal and a q-axis voltage command signal corresponding to the q-axis given current signal; and receiving and converting the d-axis voltage command signal and the q-axis voltage command signal to a three-phase command signal by the first coordinate transformation.

In another embodiment, the three-phase feedback signal, the d-axis feedback signal and the q-axis feedback signal are all current signals.

In an embodiment, when the power conversion unit includes a current source inverter (CSI), the three-phase feedback signal, the d-axis feedback signal and the q-axis feedback signal are all voltage signals.

In an embodiment, when a value of the d-axis inductance is calculated, the d-axis given current signal includes a DC component and an AC component. In another embodiment, the q-axis given current signal is zero.

In an embodiment, when a value of the d-axis inductance is calculated, the d-axis given current signal includes a DC component and an AC component, and when the amplitude of the DC component of the d-axis given current signal is constant and the amplitude of the AC component of the d-axis given current signal changes, different d-axis inductances corresponding to the AC component form a successive d-axis inductance curve.

In another embodiment, when a value of the d-axis inductance is calculated, the d-axis given current signal includes a DC component and an AC component, and when the amplitude of the DC component of the d-axis given current signal changes, the DC component with different amplitude corresponds to different d-axis inductance curves.

In an embodiment, when a value of the q-axis inductance is calculated, the q-axis given current signal further includes an AC component and the d-axis given current signal comprises a DC component.

In an embodiment, when a value of the d-axis inductance is calculated, the d-axis given current signal comprises a DC component and an AC component; and when a value of the q-axis inductance is calculated, the d-axis given current signal comprises a DC component and the q-axis given current signal an AC component, wherein the waveform of the AC component of the d-axis given current signal and/or the q-axis given current signal is a sine wave, triangular wave or sawtooth wave.

In an embodiment, when a value of the d-axis inductance is calculated, the d-axis given current signal comprises a DC component and an AC component; and when a value of the q-axis inductance is calculated, the d-axis given current signal comprises a DC component and the q-axis given current signal an AC component, wherein the frequency of the AC component of the d-axis given current signal and/or the q-axis given current signal is 0.5-3 times of the rated frequency of the permanent motor.

In another embodiment, the frequency of the AC component of the d-axis given current signal and/or the q-axis given current signal is equal to the rated frequency of the permanent motor.

In an embodiment, when a value of the q-axis inductance is calculated, the d-axis given current signal comprises a DC component and the q-axis given current signal an AC component, and when the amplitude of the DC component of the d-axis given current signal is constant and the amplitude of the AC component of the q-axis given current signal changes, different q-axis inductances corresponding to the AC component with different amplitude form a successive q-axis inductance curve.

In another embodiment, when a value of the q-axis inductance is calculated, the d-axis given current signal comprises a DC component and the q-axis given current signal an AC component, and when the amplitude of the DC component of the d-axis given current signal changes, the DC component with different amplitude corresponds to different q-axis inductance curves.

By adopting the inductance parameter measuring device of the permanent motor and the method thereof in the present disclosure, a d-axis given current signal and a q-axis given current signal are separately provided, and corresponding response signals are generated based on each d-axis given current signal and each q-axis given current signal, and thus a d-axis inductance and a q-axis inductance of the permanent motor are calculated based on the obtained response signals. By adopting this measuring device and the method thereof, no mechanical contracting brake device should be provided for the permanent motor to be measured, and the permanent motor is always held in the stationary state during the measuring process, so as to improve the measuring efficiency and reduce the measuring cost.

BRIEF DESCRIPTION OF THE DRAWINGS

In order to make the foregoing as well as other aspects, features, advantages, and embodiments of the present disclosure more apparent, the accompanying drawings are described as follows.

DETAILED DESCRIPTION

Figure 1:
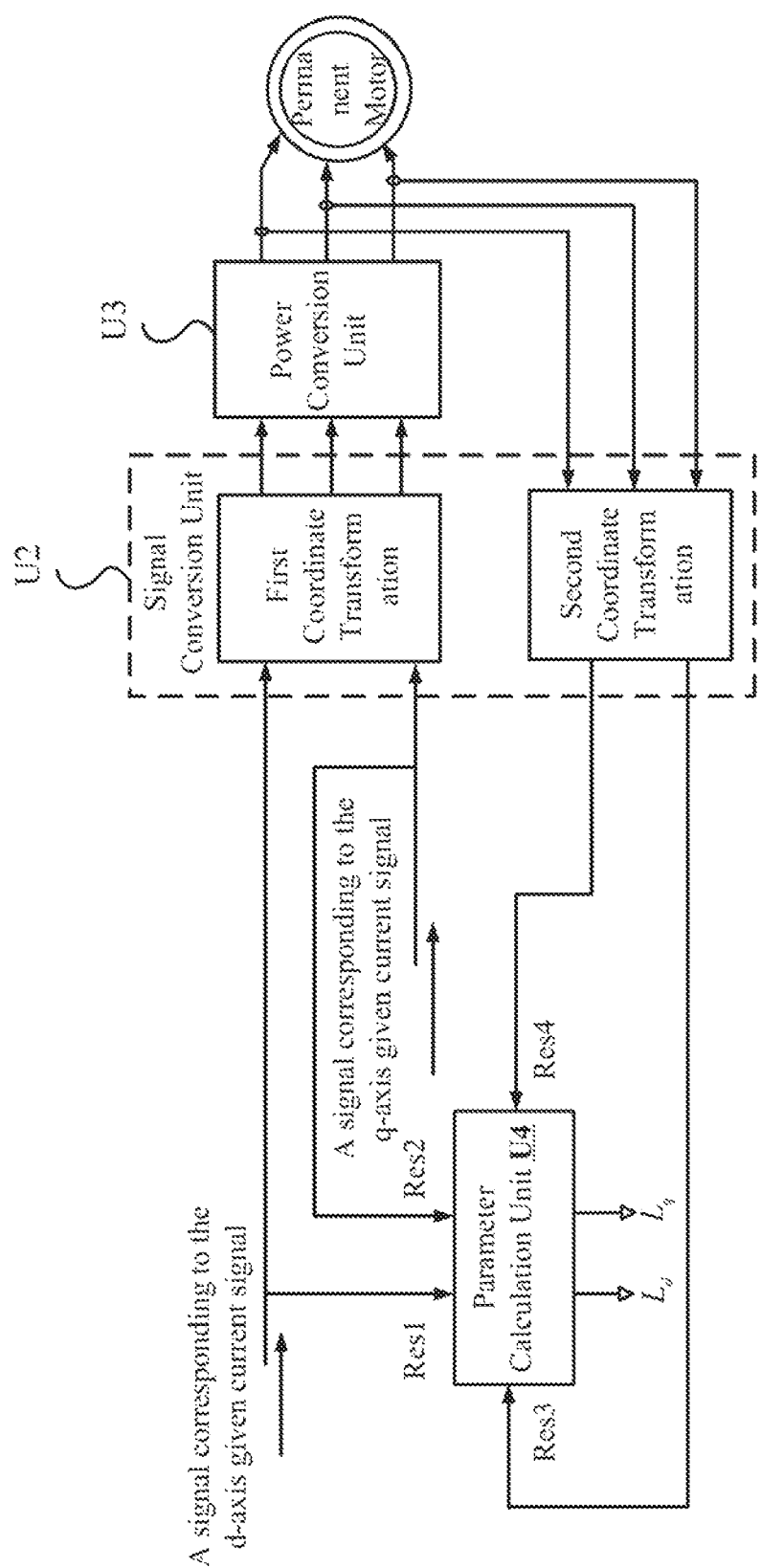
FIG. 1 illustrates a structural block diagram of an embodiment of the inductance measuring device of present disclosure.

In order to make the technical contents of the present disclosure more detailed and more comprehensive, various embodiments of the present disclosure are described below with reference to the accompanying drawings. Wherever possible, the same reference numbers are used in the drawings and the description to refer to the same or like parts. However, those of ordinary skills in the art should understand that the embodiments described below are not used for limiting the scope of the present disclosure. Moreover, the accompanying drawings are only illustrative and are not made according to the original size.

Specific implementations in various aspects of the present disclosure are further described in details below with reference to the accompanying drawings.

FIG. 1 illustrates a structural block diagram of an embodiment of the inductance measuring device of the present disclosure. Referring to FIG. 1, the inductance measuring device of the present disclosure includes a signal conversion unit U2, a power conversion unit U3 and a parameter calculation unit U4. The signal conversion unit U2 receives and then converts a signal corresponding to the d-axis given current signal and a signal corresponding to the q-axis given current signal into a three-phase command signal. The power conversion unit U3 receives the three-phase command signal and outputs a motor control signal corresponding to the three-phase command signal, so as to obtain a three-phase feedback signal based on the motor control signal. Moreover, the signal conversion unit U2 converts the three-phase feedback signal from the permanent motor into a d-axis feedback signal and a q-axis feedback signal. The parameter calculation unit U4 receives a first response signal Res1 corresponding to the d-axis given current signal, a second response signal Res2 corresponding to the q-axis given current signal, a third response signal Res3 corresponding to the d-axis feedback signal and a fourth response signal Res4 corresponding to the q-axis feedback signal. The parameter calculation unit U4 then respectively calculates a d-axis inductance $L_d$ and a q-axis inductance $L_q$ based on the first, second, third and fourth response signals Res1-Res4 when the permanent motor is in a stationary state.

In an embodiment, when the power conversion unit U3 includes a voltage source inverter (VSI), the signal corresponding to the d-axis given current signal is a d-axis voltage command signal, and the signal corresponding to the q-axis given current signal is a q-axis voltage command signal. Correspondingly, the three-phase feedback signal, the d-axis feedback signal and the q-axis feedback signal are all current signals.

In another embodiment, when the power conversion unit U3 includes a current source inverter (CSI), the signal corresponding to the d-axis given current signal is the d-axis given current signal itself, and the signal corresponding to q-axis given current signal is the q-axis given current signal itself. Correspondingly, the three-phase feedback signal, the d-axis feedback signal and the q-axis feedback signal are all voltage signals.

Figure 2:
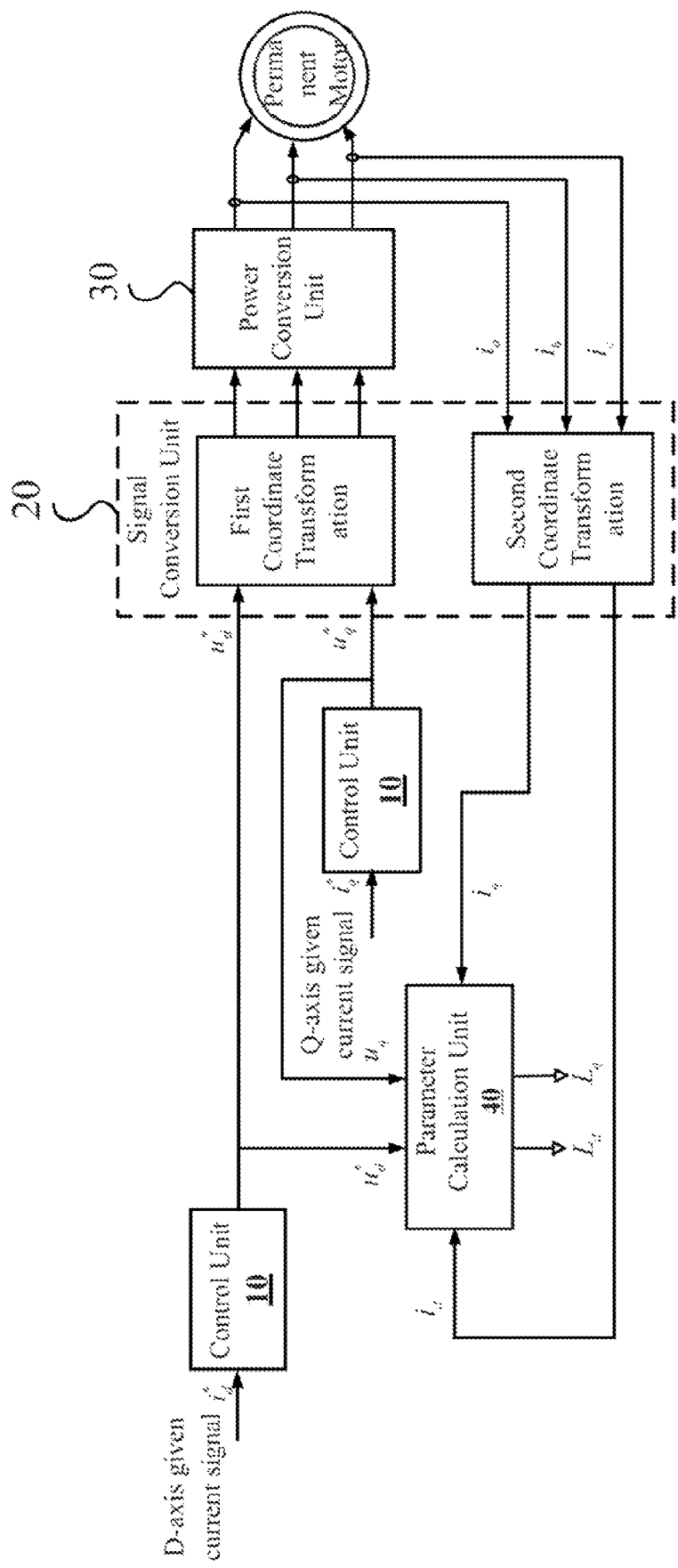
FIG. 2 illustrates a structural block diagram of a preferred embodiment of the inductance measuring device of FIG. 1.

FIG. 2 illustrates a structural block diagram of a specific embodiment of the inductance measuring device of FIG. 1. Referring to FIG. 2, the inductance measuring device includes a control unit 10, a signal conversion unit 20, a power conversion unit 30 and a parameter calculation unit 40.

In particular, the control unit 10 receives a d-axis given current signal $i^*_d$ its and a q-axis given current signal $i^*_q$, and outputs a d-axis voltage command signal $u^*_d$ corresponding to the d-axis given current signal and a q-axis voltage command signal $u^*_q$ corresponding to the q-axis given current signal. It should be understood by those of skills in the art that, the control unit 10 can be realized through software. The controller of the control unit 10 can use different control methods to output a command signal, and can adopt two signal collecting terminals of the same control IC (integrated circuit) to separately receive the d-axis given current signal and the q-axis given current signal, or can adopt each signal collecting terminal of two separate control ICs to receive the d-axis given current signal and the q-axis given current signal. However, the present disclosure is not limited thereto. For example, in other specific embodiments, the control unit 10 can be provided by using an analog circuit formed by discrete components to receive the d-axis given current signal and the q-axis given current signal.

The signal conversion unit 20 receives and then converts the d-axis voltage command signal $u^*_d$ and the q-axis voltage command signal $u^*_q$ outputted by the control unit 10 into a three-phase command signal. For example, the signal conversion unit 20 converts the d-axis voltage command signal $u^*_d$ and the q-axis voltage command signal $u^*_q$ mentioned above into a three-phase command signal by a dq/abc coordinate transformation (or referred to as a first coordinate transformation). In an embodiment of the present disclosure, the power conversion unit 30 includes a voltage source inverter (VSI), for receiving the three-phase command signal and outputting a motor control signal corresponding to the three-phase command signal, where the motor control signal is applied in the permanent motor, so as to obtain three-phase current feedback signals $i_a$, $i_b$ and $i_c$ from the permanent motor. The signal conversion unit 20 also receives and then converts the three-phase current feedback signals $i_a$, $i_b$ and $i_c$ into a d-axis current feedback signal $i_d$ and a q-axis current feedback signal $i_q$. For example, the signal conversion unit 20 converts the three-phase current feedback signals $i_a$, $i_b$ and $i_c$ into the d-axis current feedback signal $i_d$ and the q-axis current feedback signal $i_q$ by an abc/dq coordinate transformation (or referred to as a second coordinate transformation).

The parameter calculation unit 40 receives not only a first response signal corresponding to the d-axis given current signal and a second response signal corresponding to the q-axis given current signal, but also a third response signal corresponding to the d-axis feedback signal and a fourth response signal corresponding to the q-axis feedback signal. Then the parameter calculation unit 40 respectively calculates a d-axis inductance and a q-axis inductance based on the first, second, third and fourth response signals when the permanent motor is in a stationary state. In this embodiment, the first response signal may be a d-axis voltage command signal or other signals corresponding to the d-axis given current signal, such as the d-axis current feedback signal. The second response signal may be a q-axis voltage command signal or other signals corresponding to the q-axis given current signal, such as the q-axis current feedback signal. The third response signal may be a d-axis current feedback signal or other signals corresponding to the d-axis current feedback signal, such as the d-axis given current signal. The fourth response signal may be a q-axis current feedback signal or other signals corresponding to the q-axis current feedback signal, such as the q-axis given current signal.

Specially noted, it should be understood by those of skills in the art that by using the inductance measuring method of the present disclosure, the permanent motor can be maintained in the stationary state during the entire measuring process. Herein the term "stationary state" includes not only a state that the permanent motor is completely stationary, but also a state that the permanent motor does not rotate in a single-direction or a state that the permanent motor fluttering slightly has null current. In a sense, the stationary state of the permanent motor can also be understood as a free state needing no assistance from a mechanical contracting brake device.

Figure 3:
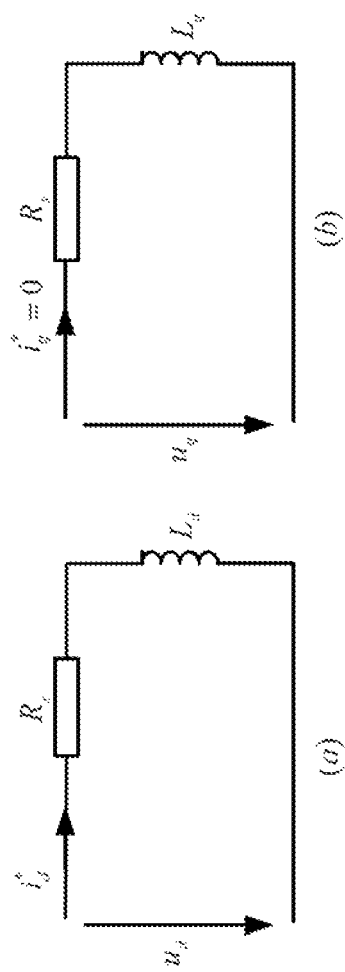
FIG. 3 illustrates a schematic d-axis equivalent circuit diagram and a schematic q-axis equivalent circuit diagram when the inductance measuring device of FIG. 2 is measuring a d-axis inductance.

FIG. 3 illustrates a schematic d-axis equivalent circuit diagram and a schematic q-axis equivalent circuit diagram when the inductance measuring device of FIG. 2 is measuring a d-axis inductance. In particular, FIG. 3 (a) shows the d-axis equivalent circuit, wherein $u_d$ represents a d-axis voltage, $i^*_d$ represents a d-axis given current signal, $R_s$ represents a stator resistance and $L_d$ represents a d-axis inductance; and FIG. 3 (b) shows the q-axis equivalent circuit, wherein $u_q$ represents a q-axis voltage, $i^*_q$ represents a q-axis given current signal and $L_q$ represents a q-axis inductance.

Referring both FIGS. 3 (a) and 3 (b), when the d-axis inductance is measured, the d-axis given current signal $i^*_d$ includes a DC component and an AC component having the frequency of $\omega_d$. In a specific embodiment, the q-axis given current signal $i^*_q$ is zero. Moreover, the q-axis given current signal $i^*_q$ may be a small current value, such as 10 mA.

It can be seen from FIG. 2 that, the parameter calculation unit 40 receives a first response signal corresponding to the d-axis given current signal and a third response signal corresponding to the d-axis current feedback signal, and calculates the d-axis inductance $L_d$ based on the first and third response signals when the permanent motor is in the stationary state.

In a specific embodiment, the first response signal received by the parameter calculation unit 40 is the d-axis voltage command signal $u^*_d$, and the third response signal received by the parameter calculation unit 40 is the d-axis current feedback signal $i_d$, such that the d-axis inductance is expressed as below:

$$L_d = \frac{U^*_{d\_AC}}{\omega_d I_{d\_AC}} \sin\varphi$$

where $U^*_{d\_AC}$ is amplitude of the AC component of the d-axis voltage command signal, $I_{d\_AC}$ is amplitude of the AC component of the d-axis current feedback signal, $\omega_d$ is a frequency of the AC component of the d-axis given current signal, and $\varphi$ is a phase difference between the AC component of the d-axis voltage command signal and the AC component of the d-axis current feedback signal.

In another specific embodiment, the first response signal received by the parameter calculation unit 40 is the d-axis voltage command signal $u^*_d$, and the third response signal received by the parameter calculation unit 40 is the d-axis current feedback signal $i_d$, such that the d-axis inductance is expressed as below:

$$L_d = \frac{U^{*2}_{d\_AC}}{\omega_d Q_d} \text{ or } L_d = \frac{Q_d}{\omega_d I^2_{d\_AC}}$$

where $Q_d$ is a reactive power generated at an inductance $L_d$ by the AC component of the d-axis given current signal and can be obtained from $U^*_{d\_AC} * I_{d\_AC} * \sin\varphi$ or obtained by integral calculation in advance, $U^*_{d\_AC}$ is the amplitude of the AC component of the d-axis voltage command signal, $I_{d\_AC}$ is the amplitude of the AC component of the d-axis current feedback signal, and is the phase difference between the AC component of the d-axis voltage command signal and the AC component of the d-axis current feedback signal.

It should be understood by those of skills in the art that, although in multiple embodiments mentioned above the d-axis inductance as an inductance parameter of the permanent motor is calculated by using various electrical parameters (voltage, current or reactive power), the method for calculating the d-axis inductance of the present disclosure is not limited thereto. For example, the changing rate of the d-axis current feedback signal over time and the d-axis voltage command signal can be obtained in advance, so as to calculate the d-axis inductance.

In a specific embodiment, the waveform of the AC component of the d-axis given current signal is a sine wave triangular wave or saw-tooth wave. Furthermore, if the inputted frequency of the AC component is small, the signal-to-noise ratio (SNR) of the system will be low, such that the accuracy of the effective information of the response voltage signal or response current signal is poor, thereby obtaining a d-axis inductance with a large error. Furthermore, if the inputted frequency of the AC component is large and the reactance of the permanent motor is large, then when the output voltage of a converter is saturated, no actual inductance can be obtained. Thus, the frequency of the AC component is 0.5-3 times of a rated frequency of the permanent motor. For example, in order to obtain the inductance value reliably, the frequency of the AC component is provided as equal to the rated frequency of the permanent motor.

Figure 4:
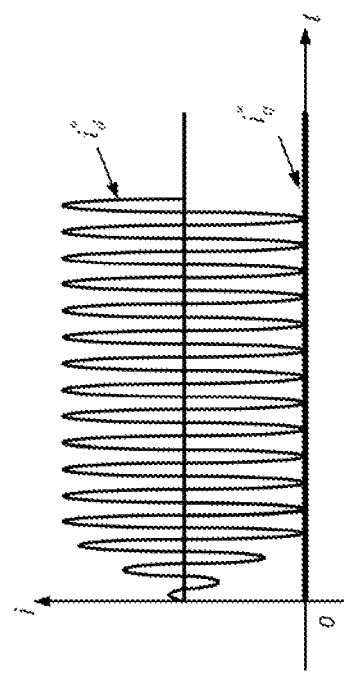
FIG. 4 illustrates a curve diagram showing that the d-axis current waveform and the q-axis current waveform change over time when the inductance measuring device of FIG. 2 is measuring a d-axis inductance.

FIG. 4 illustrates a curve diagram showing that the d-axis current waveform and the q-axis current waveform change over time when the inductance measuring device of FIG. 2 is measuring a d-axis inductance. Referring to FIG. 4, in a specific embodiment, during measuring of the d-axis inductance, the d-axis given current signal $i^*_d$ is a composite signal superimposed by a DC component and an AC component, and q-axis given current signal $i^*_q$ is zero.

Figure 5:
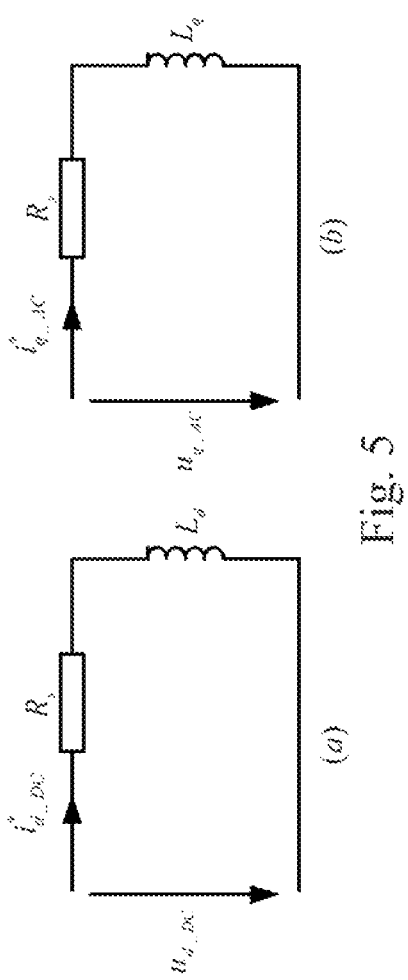
FIG. 5 illustrates a schematic d-axis equivalent circuit diagram and a schematic q-axis equivalent circuit diagram when the inductance measuring device of FIG. 2 is measuring a q-axis inductance.

FIG. 5 illustrates a schematic d-axis equivalent circuit diagram and a schematic q-axis equivalent circuit diagram when the inductance measuring device of FIG. 2 is measuring a q-axis inductance. In particular, FIG. 5 (a) shows the d-axis equivalent circuit, where $u_{d\_DC}$ represents a d-axis DC voltage, $i^*_{d\_DC}$ represents a DC component of the d-axis given current signal, $R_s$ represents a stator resistance and $L_d$ represents a d-axis inductance; and FIG. 5 (b) shows the q-axis equivalent circuit, where $u_{d\_AC}$ represents a q-axis AC voltage, $i^*_{d\_AC}$ represents a q-axis given current signal and $L_q$ represents a q-axis inductance.

Referring both FIGS. 5 (a) and 5 (b), during measuring of the q-axis inductance, the d-axis given current signal $i^*_d$ includes a DC component $i^*_{d\_DC}$ so as to lock the rotor shaft, and meanwhile the q-axis given current signal $i^*_q$ includes an AC component $i^*_{d\_AC}$.

It can be seen from FIG. 2 that, the parameter calculation unit 40 receives a second response signal corresponding to the q-axis given current signal and a fourth response signal corresponding to the q-axis current feedback signal, and calculates the q-axis inductance $L_q$ based on the second and the fourth response signals when the permanent motor is in the stationary state.

In a specific embodiment, the second response signal received by the parameter calculation unit 40 is the q-axis voltage command signal $u^*_q$, and the fourth response signal received by the parameter calculation unit 40 is the q-axis current feedback signal $i_q$, such that the q-axis inductance is expressed as below:

$$L_q = \frac{U^*_{q\_AC}}{\omega_q I_{q\_AC}} \sin\varphi$$

where $U^*_{d\_AC}$ is amplitude of the AC component of the q-axis voltage command signal, $I_{d\_AC}$ is amplitude of the AC component of the q-axis current feedback signal, $\omega_q$ is a frequency of the AC component of the q-axis given current signal, and $\varphi$ is a phase difference between the AC component of the q-axis voltage command signal and the AC component of the q-axis current feedback signal.

In another specific embodiment, the second response signal received by the parameter calculation unit 40 is the q-axis voltage command signal $u^*_q$, and the fourth response signal received by the parameter calculation unit 40 is the q-axis current feedback signal $i_q$, such that the q-axis inductance is expressed as below:

$$L_q = \frac{U^{*2}_{q\_AC}}{\omega_q Q_q} \text{ or } L_q = \frac{Q_q}{\omega_q I^2_{q\_AC}}$$

where $Q_q$ is a reactive power generated at an inductance $L_d$ by the AC component of the q-axis given current signal and can be obtained from $U^*_{q\_AC} * I_{q\_AC} * \sin\varphi$ or obtained by integral calculation in advance, $\varphi$ is the phase difference between the AC component of the q-axis voltage command signal and the AC component of the q-axis current feedback signal, $U^*_{q\_AC}$ is the amplitude of the AC component of the q-axis voltage command signal, $I_{q\_AC}$ is the amplitude of the AC component of the q-axis current feedback signal, and $\omega_q$ is a frequency of the AC component of the q-axis given current signal.

It should be understood by those of skills in the art that, although in multiple embodiments mentioned above the q-axis inductance as an inductance parameter of the permanent motor is calculated by using various electrical parameters (voltage, current or reactive power), the method for calculating the q-axis inductance of the present disclosure is not limited thereto. For example, the changing rate of the q-axis current feedback signal over time and the q-axis voltage command signal can be obtained in advance, so as to calculate the q-axis inductance.

In a specific embodiment, the waveform of the AC component of the q-axis given current signal is a sine wave, triangular wave or saw-tooth wave. Furthermore, if the inputted frequency of the AC component is small, the SNR of the system will be low, such that the accuracy of the effective information of the response voltage signal or response current signal is poor, thereby obtaining a q-axis inductance with a large error. Furthermore, if the inputted frequency of the AC component is large and the reactance of the permanent motor is large, then when the output voltage of a converter is saturated, no actual inductance can be obtained. Thus, the frequency of the AC component is 0.5-3 times of a rated frequency of the permanent motor. For example, in order to obtain the inductance value reliably, the frequency of the AC component is provided as equal to the rated frequency of the permanent motor.

Figure 6:
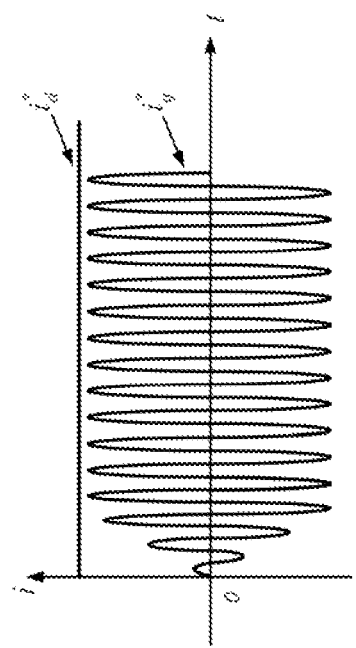
FIG. 6 illustrates a curve diagram showing that the d-axis current waveform and the q-axis current waveform change over time when the inductance measuring device of FIG. 2 is measuring a q-axis inductance.

FIG. 6 illustrates a curve diagram showing that the d-axis current waveform and the q-axis current waveform change over time when the inductance measuring device of FIG. 2 is measuring a q-axis inductance. Referring to FIG. 6, in a specific embodiment, during measuring of the q-axis inductance, the q-axis given current signal $i^*_q$ is an AC signal, and the d-axis given current signal $i^*_d$ is a DC signal.

Figure 7:
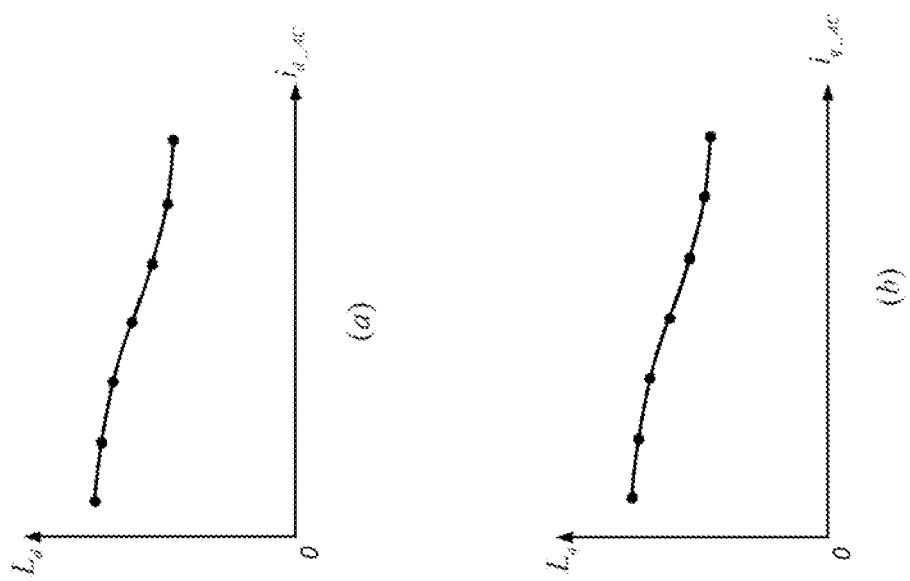
FIG. 7(a) illustrates a curve of d-axis inductances when in the inductance measuring device of FIG. 2 the amplitude of the DC component of the d-axis given current signal is constant and the amplitude of the AC component of the d-axis given current signal changes.
FIG. 7(b) illustrates a curve of q-axis inductances when in the inductance measuring device of FIG. 2 the amplitude of the DC component of the d-axis given current signal is constant and the amplitude of the AC component of the q-axis given current signal changes.

FIG. 7(a) illustrates a curve of d-axis inductances when in the inductance measuring device of FIG. 2 the amplitude of the DC component of the d-axis given current signal is constant and the amplitude of the AC component of the d-axis given current signal changes. Referring to FIG. 7(a), during measuring of the d-axis inductance, when the amplitude of the DC component of the d-axis given current signal is constant and the amplitude of the AC component of the d-axis given current signal changes, different d-axis inductances corresponding to the AC component with different amplitude form a successive d-axis inductance curve. In a specific embodiment, when the amplitude of the DC component of the d-axis given current signal changes, the DC component with different amplitude can form a set of successive d-axis inductance curves mentioned above, and the DC component with different amplitude corresponds to a set of different d-axis inductance curves.

FIG. 7(b) illustrates a curve of q-axis inductances when in the inductance measuring device of FIG. 2 the amplitude of the DC component of the d-axis given current signal is constant and the amplitude of the AC component of the q-axis given current signal changes. Referring to FIG. 7(b), during measuring of the q-axis inductance, when the amplitude of the DC component of the d-axis given current signal is constant and the amplitude of the AC component of the q-axis given current signal changes, different q-axis inductances corresponding to the AC component with different amplitude form a successive q-axis inductance curve. In a specific embodiment, when the amplitude of the DC component of the d-axis given current signal changes, the DC component with different amplitude can form a set of successive q-axis inductance curves mentioned above, and the DC component with different amplitude corresponds to a set of different q-axis inductance curves.

Figure 8:
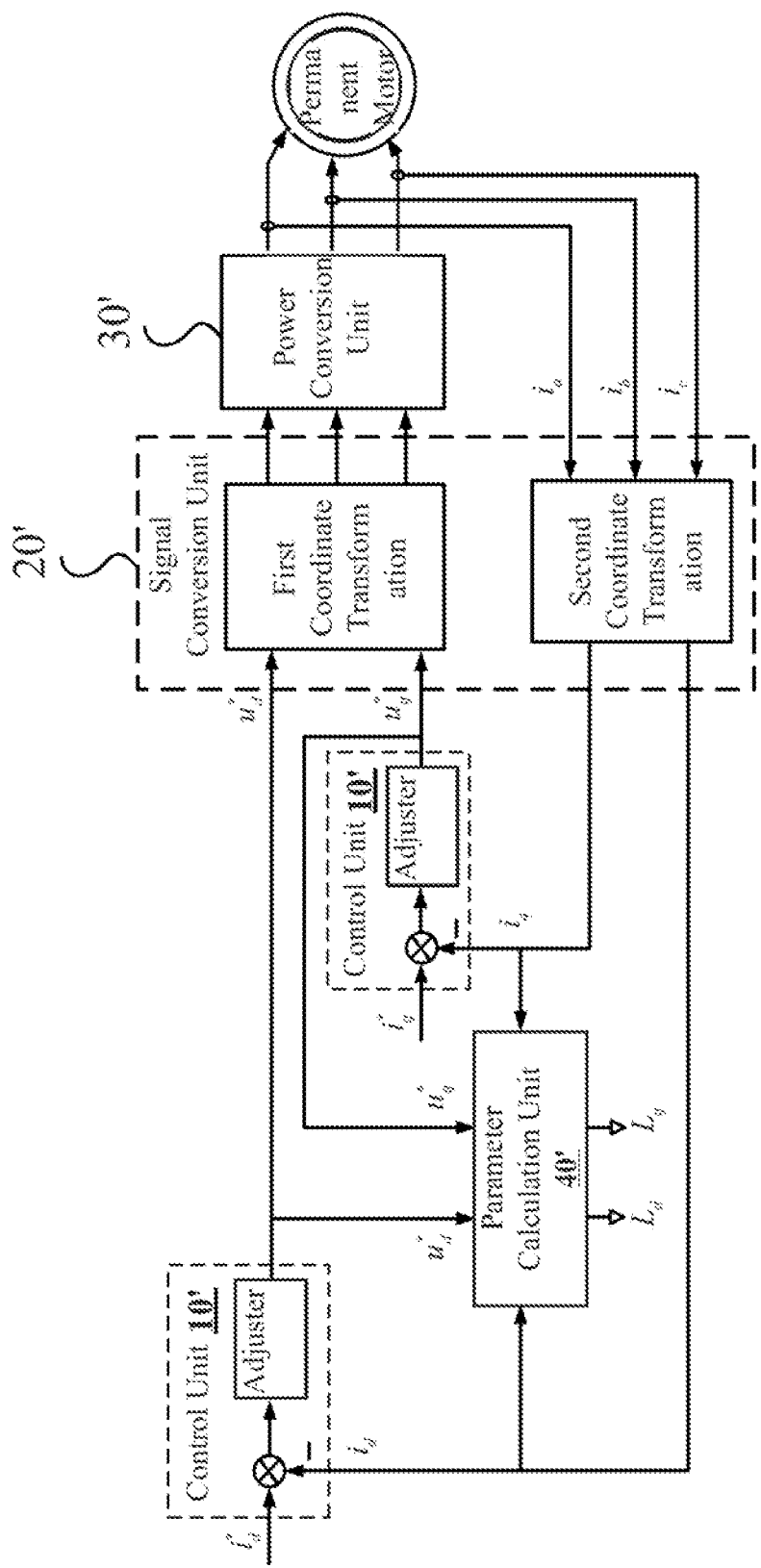
FIG. 8 illustrates a structural block diagram of a preferred embodiment of the inductance measuring device of FIG. 2.

FIG. 8 illustrates a structural block diagram of a specific embodiment of the inductance measuring device of FIG. 2. Referring to FIG. 8, the inductance measuring device includes a control unit 10', a signal conversion unit 20', a power conversion unit 30' and a parameter calculation unit 40'. The signal conversion unit 20', the power conversion unit 30' and the parameter calculation unit 40' are similar to or the same as the signal conversion unit 20, the power conversion unit 30 and the parameter calculation unit 40 of FIG. 1, and for simplicity of description, it is not illustrated here any further.

In a specific embodiment, the control unit 10' also receives a d-axis current feedback signal $i_d$, and generates the d-axis voltage command signal $u^*_d$ according to the d-axis given current signal and the d-axis current feedback signal $i_d$, so as to form a closed loop control. For example, the control unit 10' includes a first comparator and a first adjuster. The first comparator receives and then compares the d-axis given current signal and the d-axis current feedback signal to output a comparison signal. The first adjuster receives the comparison signal and generates the d-axis voltage command signal according to the comparison signal.

In another specific embodiment, the control unit 10' also receives a q-axis current feedback signal $i_q$, and generates the q-axis voltage command signal $u^*_q$ according to the q-axis given current signal $i^*_q$ and the q-axis current feedback signal $i_q$, so as to form the closed loop control. For example, the control unit 10' includes a second comparator and a second adjuster. The second comparator receives and then compares the q-axis given current signal and the q-axis current feedback signal to output a comparison signal. The second adjuster receives the comparison signal and generates the q-axis voltage command signal according to the comparison signal.

Figure 9:
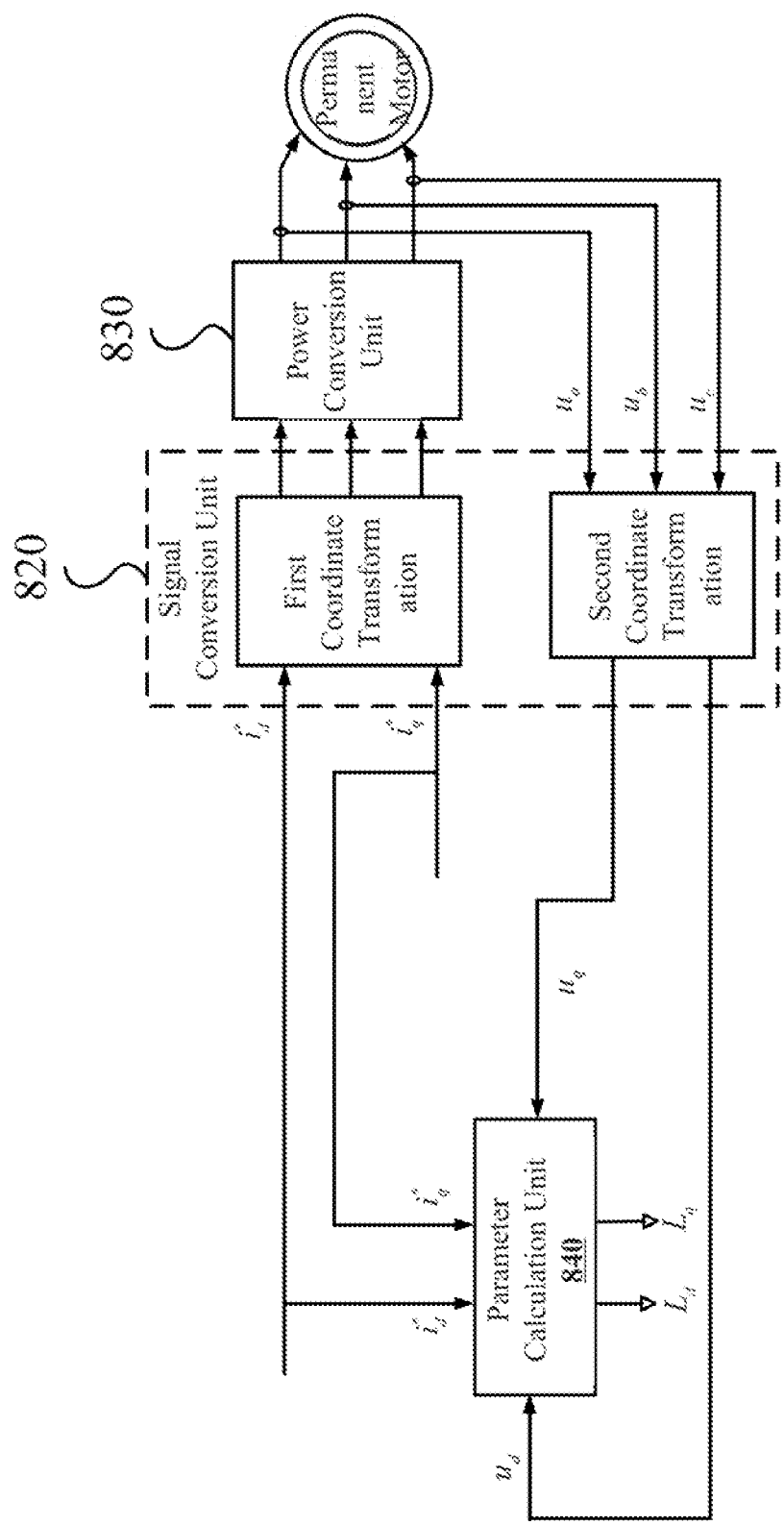
FIG. 9 illustrates a structural block diagram of a preferred embodiment of the inductance measuring device of FIG. 1.

FIG. 9 illustrates a structural block diagram of a specific embodiment of the inductance measuring device of FIG. 1. Referring to FIG. 9, the inductance measuring device includes a signal conversion unit 820, a power conversion unit 830 and a parameter calculation unit 840.

In particular, the signal conversion unit 820 receives and then converts a d-axis given current signal $i^*_d$ and a q-axis given current signal $i^*_q$ into a three-phase command signal. For example, the signal conversion unit 820 converts the d-axis given current signal $i^*_d$ and a q-axis given current signal $i^*_q$ mentioned above into a three-phase command signal by a dq/abc coordinate transformation (or referred to as a first coordinate transformation). In this embodiment, the power conversion unit 830 includes a current source inverter (CSI), for receiving the three-phase command signal and outputting a motor control signal corresponding to the three-phase command signal, where the motor control signal is applied in the permanent motor, so as to obtain three-phase voltage feedback signals $u_a$, $u_b$ and $u_c$ from the permanent motor. The signal conversion unit 820 also receives and then converts the three-phase voltage feedback signals $u_a$, $u_b$ and $u_c$ into a d-axis voltage feedback signal $u_d$ and a q-axis voltage feedback signal $u_q$. For example, the signal conversion unit 820 converts the three-phase voltage feedback signals $u_a$, $u_b$ and $u_c$ into the d-axis voltage feedback signal $u_d$ and the q-axis voltage feedback signal $u_q$ by an abc/dq coordinate transformation (or referred to as a second coordinate transformation).

The parameter calculation unit 840 receives not only a first response signal corresponding to the d-axis given current signal and a second response signal corresponding to the q-axis given current signal, but also a third response signal corresponding to the d-axis feedback signal and a fourth response signal corresponding to the q-axis feedback signal. Then the parameter calculation unit 840 respectively calculates a d-axis inductance and a q-axis inductance based on the first, second, third and fourth response signals when the permanent motor is in a stationary state. For example, the first response signal may be a d-axis given current signal directly or other signals corresponding to the d-axis given current signal. The second response signal may be a q-axis given current signal directly or other signals corresponding to the q-axis given current signal. The third response signal may be a d-axis voltage feedback signal directly or other signals corresponding to the d-axis voltage feedback signal. The fourth response signal may be a q-axis voltage feedback signal directly or other signals corresponding to the q-axis voltage feedback signal.

The inductance measuring device of the permanent motor including the CSI may also include a control unit used for receiving the d-axis given signal and the q-axis given signal, and generating the corresponding d-axis command signal and q-axis command signal. The signal conversion unit 820 receives and then converts the d-axis command signal and the q-axis command signal into the three-phase command signal by the dq/abc coordinate transformation (or referred to as the first coordinate transformation), so as to measure inductance parameters. At the same time the control unit can also receive a d-axis feedback signal and a q-axis feedback signal, so as to form a closed loop control.

The measuring and calculating method of the d-axis inductance and the q-axis inductance is the same as that of the d-axis inductance and the q-axis inductance parameter of FIG. 2, and thus it is not illustrated here any further. The specific measuring process may refer to FIGS. 3-6, and the d-axis inductance curve and the q-axis inductance curve may refer to FIGS. 7(a) and 7(b).

Figure 10:
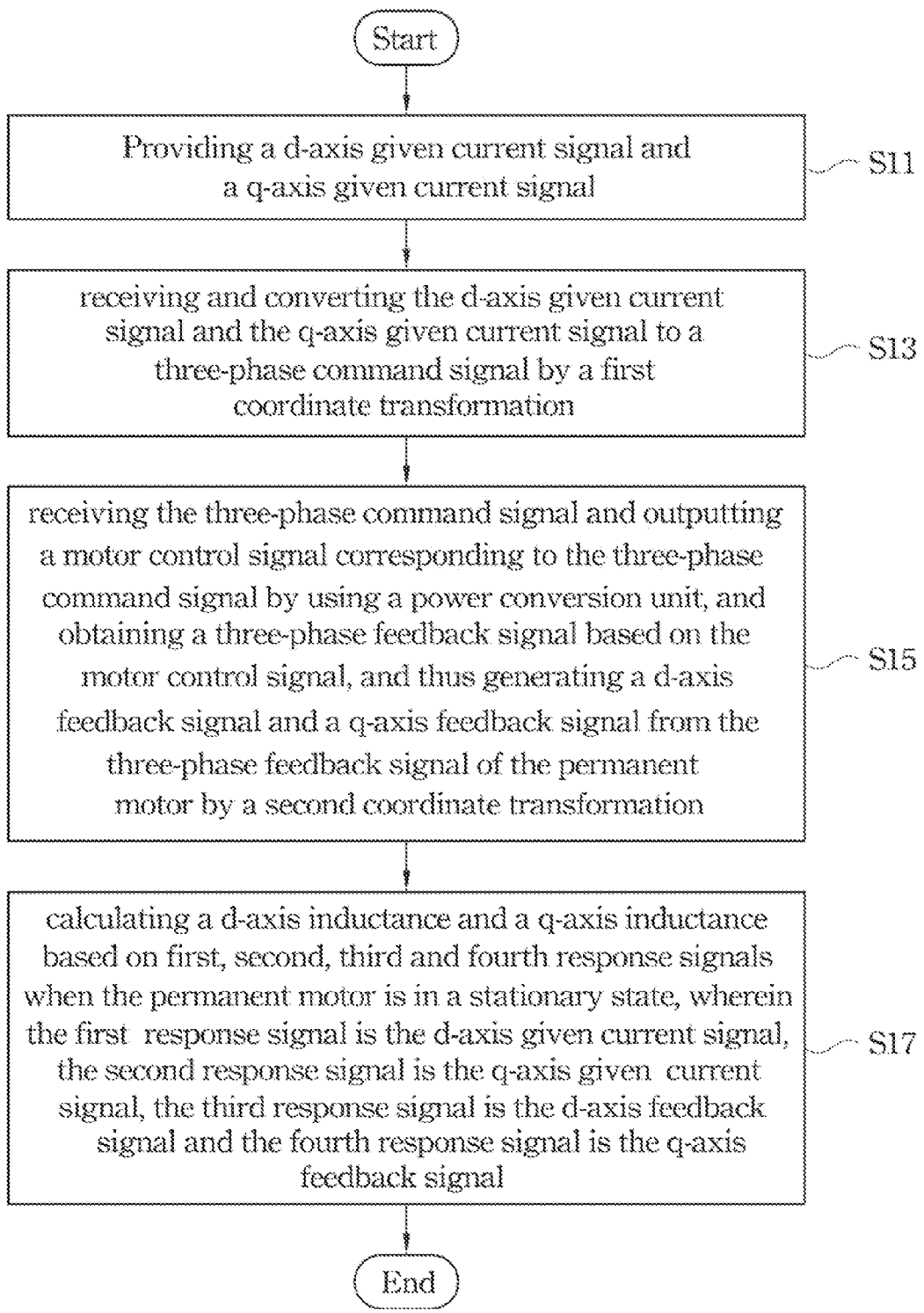
FIG. 10 illustrates a flow chart of a method for measuring the inductance parameter of a permanent motor according to a preferred embodiment of, present disclosure.

FIG. 10 illustrates a flow chart of a method for measuring the inductance parameters of a permanent motor according to a preferred embodiment of the present disclosure. It should be pointed out that, the inductance measuring method corresponds to the inductance measuring device shown in FIG. 2 or 9, and thus the description of the realizing process of the inductance measuring method may correspondingly refer to the structural block diagram of the inductance measuring device shown in FIG. 2 or 9.

Referring to FIG. 10, in this measuring method, step S11 is first performed so as to provide a d-axis given current signal and a q-axis given current signal. Subsequently in step S13, a first coordinate transformation converts the d-axis given current signal and the q-axis given current signal to a three-phase command signal. Afterwards in step S15, a power conversion unit receives the three-phase command signal and outputs a motor control signal corresponding to the three-phase command signal, and a three-phase feedback signal is obtained based on the motor control signal, such that a d-axis feedback signal and a q-axis feedback signal are generated from the three-phase feedback signal of the permanent motor by a second coordinate transformation. Finally in step S17, a d-axis inductance and a q-axis inductance are calculated based on the first, second, third and fourth response signals when the permanent motor is in a stationary state, wherein a first response signal is the d-axis given current signal, a second response signal is the q-axis given current signal, a third response signal is the d-axis feedback signal and a fourth response signal is the q-axis feedback signal.

In a specific embodiment, the power conversion unit is a VSI or a CSI.

Figure 11:
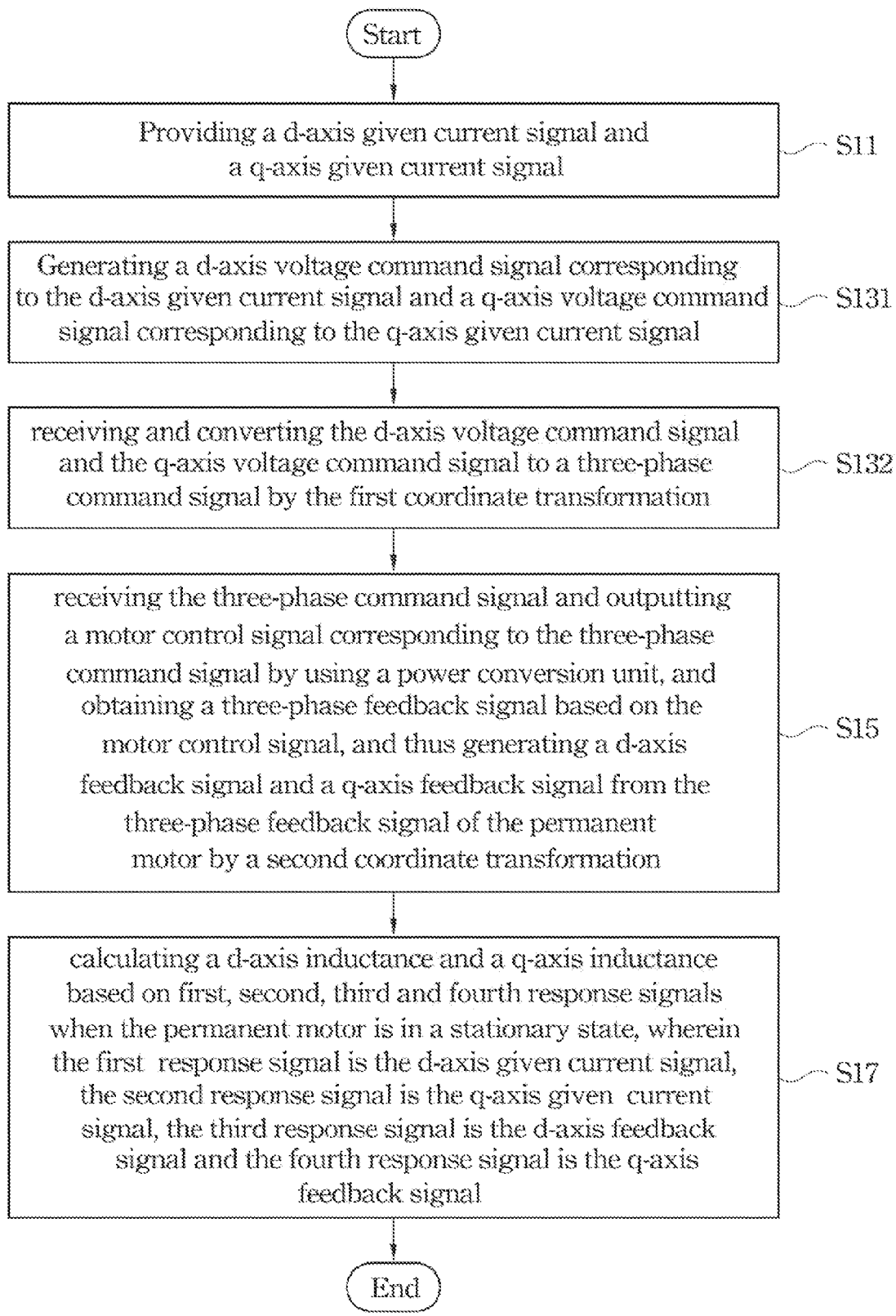
FIG. 11 illustrates a flow chart of the inductance measuring method of FIG. 10 when the power conversion unit is a VSI.

FIG. 11 illustrates a flow chart of, the inductance measuring method of FIG. 10 when the power conversion unit is a VSI.

Referring to FIG. 11, when the power conversion unit includes the VSI, the step S13 mentioned above also includes steps S131 and S132. In step S131, a d-axis voltage command signal corresponding to the d-axis given current signal and a q-axis voltage command signal corresponding to the q-axis given current signal are generated, and then in step S132, a first coordinate transformation converts the d-axis voltage command signal and the q-axis voltage command signal to a three-phase command signal. Furthermore, the three-phase feedback signal, the d-axis feedback signal and the q-axis feedback signal are current signals.

In the inductance measuring method, when the power conversion unit is the CSI, the three-phase feedback signal, the d-axis feedback signal and the q-axis feedback signal as shown in FIG. 10 are voltage signals.

The above provides a detailed description of the measuring device and the method for measuring the inductance parameter of the permanent motor in the present disclosure in cooperation with multiple specific embodiments. In these embodiments, the control unit, the signal conversion unit, the power conversion unit and the parameter calculation unit can be realized by a software or hardware manner. For example, if taking the performing frequency as the first consideration, each unit in the measuring device mentioned above may be mainly hardware; if taking design flexibility as the first consideration, each unit in the measuring device mentioned above may be mainly software; and alternatively these units can also simultaneously use software, hardware or a combination thereof.

By adopting the inductance parameter measuring device of the permanent motor and the method thereof in the present disclosure, a d-axis given current signal and a q-axis given current signal are separately provided, and corresponding response signals are generated by each d-axis given current signal and each q-axis given current signal, and thus a d-axis inductance and a q-axis inductance of the permanent motor are calculated based on the obtained response signals. By adopting this measuring device and the method thereof, no mechanical contracting brake device should be provided for the permanent motor to be measured, and the permanent motor is always held in the stationary state during the measuring process, so as to improve the measuring efficiency and reduce the measuring cost.

Although the present disclosure has been disclosed with reference to the above embodiments, these embodiments are not intended to limit the present disclosure. It will be apparent to those of skills in the art that various modifications and variations can be made without departing from the spirit and scope of the present disclosure. Therefore, the scope of the present disclosure shall be defined by the appended claims.

What is claimed is:

1. An inductance measuring device for measuring an inductance parameter of a permanent motor, the inductance measuring device comprising:
    a signal conversion unit, for converting a signal corresponding to a d-axis given current signal and a signal corresponding to a q-axis given current signal into a three-phase command signal, and converting a three-phase feedback signal of the permanent motor into a d-axis feedback signal and a q-axis feedback signal;
    a power conversion unit for receiving the three-phase command signal and outputting a motor control signal corresponding to the three-phase command signal, so as to obtain the three-phase feedback signal based on the motor control signal; and
    a parameter calculation unit, for receiving a first response signal corresponding to the d-axis given current signal, a second response signal corresponding to the q-axis given current signal, a third response signal corresponding to the d-axis feedback signal and a fourth response signal corresponding to the q-axis feedback signal, and calculating a d-axis inductance and a q-axis inductance based on the first, second, third and fourth response signals when the permanent motor is in a stationary state.

2. The inductance measuring device of claim 1, wherein the power conversion unit comprises a voltage source inverter, and the inductance measuring device further comprises:
    a control unit, for receiving the d-axis given current signal and the q-axis given current signal, and outputting a d-axis voltage command signal corresponding to the d-axis given current signal and a q-axis voltage command signal corresponding to the q-axis given current signal;
    wherein the signal conversion unit receives and converts the d-axis voltage command signal and the q-axis voltage command signal into the three-phase command signal.

3. The inductance measuring device of claim 2, wherein the three-phase feedback signal, the d-axis feedback signal and the q-axis feedback signal are all current signals.

4. The inductance measuring device of claim 1, wherein the power conversion unit comprises a current source inverter, and the three-phase feedback signal, the d-axis feedback signal and the q-axis feedback signal are all voltage signals.

5. The inductance measuring device of claim 2, wherein when a value of the d-axis inductance is calculated, the d-axis given current signal comprises a DC component and an AC component.

6. The inductance measuring device of claim 4, wherein when a value of the d-axis inductance is calculated, the d-axis given current signal comprises a DC component and an AC component.

7. The inductance measuring device of claim 5, wherein the q-axis given current signal is zero.

8. The inductance measuring device of claim 6, wherein the q-axis given current signal is zero.

9. The inductance measuring device of claim 5, wherein the first response signal is the d-axis voltage command signal, and the third response signal is the d-axis current feedback signal, such that the d-axis inductance is expressed as below:

$$L_d = \frac{U^*_{q\_AC}}{\omega_d I_{d\_AC}}\sin\varphi \text{ or } L_d = \frac{U^{*2}_{q\_AC}}{\omega_d Q_d} \text{ or } L_d = \frac{Q_d}{\omega_d I^2_{d\_AC}}$$

wherein, $U^*_{d\_AC}$ is amplitude of the AC component of the d-axis voltage command signal, $I_{d\_AC}$ is amplitude of the AC component of the d-axis current feedback signal, $\omega_d$ is a frequency of the AC component of the d-axis given current signal, $\varphi$ is a phase difference between the AC component of the d-axis voltage command signal and the AC component of the d-axis current feedback is signal, and $Q_d$ is an reactive power generated at the d-axis inductance by the AC component of the d-axis given current signal and obtained from $U^*_{d\_AC} * I_{d\_AC} * \sin\varphi$.

10. The inductance measuring device of claim 6, wherein the first response signal is the d-axis given current signal, and the third response signal is the d-axis voltage feedback signal, such that the d-axis inductance is expressed as below:

$$L_d = \frac{U_{d\_AC}}{\omega_d I^*_{d\_AC}} \sin\varphi \text{ or } L_d = \frac{Q_d}{\omega_d I^{*2}_{d\_AC}} \text{ or } L_d = \frac{U^2_{d\_AC}}{\omega_d Q_d}$$

wherein, $I^*_{d\_AC}$ is amplitude of the AC component of the d-axis given current signal, $U_{d\_AC}$ is amplitude of the AC component of the d-axis voltage feedback signal, $\omega_d$ is a frequency of the AC component of the d-axis given current signal, $\phi$ is a phase difference between the AC component of the d-axis voltage feedback signal and the AC component of the d-axis given current signal, and $Q_d$ is an reactive power generated at the d-axis inductance by the AC component of the d-axis given current signal and obtained from $U_{d\_AC} * I^*_{d\_AC} * \sin\phi$.

11. The inductance measuring device of claim 1, wherein when a value of the d-axis inductance is calculated, the d-axis given current signal comprises a DC component and an AC component, and when the amplitude of the DC component of the d-axis given current signal is constant and the amplitude of the AC component of the d-axis given current signal changes, different d-axis inductances corresponding to the AC component form a successive d-axis inductance curve.

12. The inductance measuring device of claim 1, wherein when a value of the d-axis inductance is calculated, the d-axis given current signal comprises a DC component and an AC component, and when the amplitude of the DC component of the d-axis given current signal changes, the DC component with different amplitude corresponds to different d-axis inductance curves.

13. The inductance measuring device of claim 2, wherein when a value of the q-axis inductance is calculated, the d-axis given current signal comprises a DC component and the q-axis given current signal comprises an AC component.

14. The inductance measuring device of claim 4, wherein when a value of the q-axis inductance is calculated, the d-axis given current signal comprises a DC component and the q-axis given current signal comprises an AC component.

15. The inductance measuring device of claim 13, wherein the second response signal is the q-axis voltage command signal, and the fourth response signal is the q-axis current feedback signal, such that the q-axis inductance is expressed as below:

$$L_q = \frac{U^*_{q\_AC}}{\omega_q I_{q\_AC}} \sin\varphi \text{ or } L_q = \frac{U^{*2}_{q\_AC}}{\omega_q Q_d} \text{ or } L_q = \frac{Q_q}{\omega_q I^2_{q\_AC}}$$

wherein, $U^*_{q\_AC}$ is amplitude of the AC component of the q-axis voltage command signal, $I_{q\_AC}$ is amplitude of the AC component of the q-axis current feedback signal, $\omega_q$ is a frequency of the AC component of the q-axis given current signal, $\phi$ is a phase difference between the AC component of the q-axis voltage command signal and the AC component of the q-axis current feedback signal, and $Q_q$ is an reactive power generated at the q-axis inductance $L_q$ by the AC component of the q-axis given current signal and obtained from $U^*_{q\_AC} * I_{q\_AC} * \sin\phi$.

16. The inductance measuring device of claim 14, wherein the second response signal is the q-axis given current signal, and the fourth response signal is the q-axis voltage feedback signal, such that the q-axis inductance is expressed as below:

$$L_q = \frac{U_{q\_AC}}{\omega_q I^*_{q\_AC}} \sin\varphi \text{ or } L_q = \frac{Q_q}{\omega_q I^{*2}_{q\_AC}} \text{ or } L_q = \frac{U^2_{q\_AC}}{\omega_q Q_d}$$

wherein, $I^*_{q\_AC}$ is the amplitude of the q-axis given current signal, $U_{q\_AC}$ is the amplitude of the q-axis voltage feedback signal, $\omega_q$ is the frequency of the AC component of the q-axis given current signal, $\phi$ is the phase difference between the AC component of the q-axis voltage feedback signal and the AC component of the q-axis given current signal, and $Q_q$ is the reactive power generated at the q-axis inductance by the AC signal and is obtained from the $U_{q\_AC} * I^*_{q\_AC} * \sin\phi$.

17. The inductance measuring device of claim 1, wherein when a value of the d-axis inductance is calculated, the d-axis given current signal comprises a DC component and an AC component; and when a value of the q-axis inductance is calculated, the d-axis given current signal comprises a DC component and the q-axis given current signal comprises an AC component, wherein, the waveform of the AC component of the d-axis given current signal and/or the q-axis given current signal is a sine wave, triangular wave or saw-tooth wave.

18. The inductance measuring device of claim 1, wherein when a value of the d-axis inductance is calculated, the d-axis given current signal comprises a DC component and an AC component; and when a value of the q-axis inductance is calculated, the d-axis given current signal comprises a DC component and the q-axis given current signal an AC component, wherein, the frequency of the AC component of the d-axis given current signal and/or the q-axis given current signal is 0.5-3 times of the rated frequency of the permanent motor.

19. The inductance measuring device of claim 18, wherein the frequency of the AC component of the d-axis given current signal and/or the q-axis given current signal is equal to the rated frequency of the permanent motor.

20. The inductance measuring device of claim 1, wherein when a value of the q-axis inductance is calculated, the d-axis given current signal comprises a DC component and the q-axis given current signal comprises an AC component, and when the amplitude of the DC component of the d-axis given current signal is constant and the amplitude of the AC component of the q-axis given current signal changes, different q-axis inductances corresponding to the AC component form a successive q-axis inductance curve.

21. The inductance measuring device of claim 1, wherein when a value of the q-axis inductance is calculated, the d-axis given current signal comprises a DC component and the q-axis given current signal comprises an AC component, and when the amplitude of the DC component of the d-axis given current signal changes, the DC component with different amplitude corresponds to different q-axis inductance curves.

22. The inductance measuring device of claim 2, wherein the control unit is further used to perform at least one of the follows:

receiving the d-axis current feedback signal and generating the d-axis voltage command signal according to the d-axis given current signal and the d-axis current feedback signal;

receiving the q-axis current feedback signal and generating the q-axis voltage command signal according to the q-axis given current signal and the q-axis current feedback signal.

23. The inductance measuring device of claim 22, wherein the control unit further comprises:
   a comparator, for receiving and then comparing the d-axis given current signal and the d-axis current feedback signal so as to output a comparison signal; and
   an adjuster, for receiving the comparison signal and generating the d-axis voltage command signal according to the comparison signal.

24. The inductance measuring device of claim 22, wherein the control unit further comprises:
   a comparator, for receiving and then comparing the q-axis given current signal and the q-axis current feedback signal so as to output a comparison signal; and
   an adjuster, for receiving the comparison signal and generating the q-axis voltage command signal according to the comparison signal.

25. A method for measuring an inductance parameter of a permanent motor, the method comprising:
   (a) providing a d-axis given current signal and a q-axis given current signal;
   (b) receiving and converting the d-axis given current signal and the q-axis given current signal to a three-phase command signal by a first coordinate transformation;
   (c) receiving the three-phase command signal and outputting a motor control signal corresponding to the three-phase command signal by using a power conversion unit, and obtaining a three-phase feedback signal based on the motor control signal, and thus generating a d-axis feedback signal and a q-axis feedback signal from the three-phase feedback signal of the permanent motor by a second coordinate transformation;
   (d) calculating a d-axis inductance and a q-axis inductance based on first, second, third and fourth response signals when the permanent motor is in a stationary state, wherein the first response signal is the d-axis given current signal, the second response signal is the q-axis given current signal, the third response signal is the d-axis feedback signal and the fourth response signal is the q-axis feedback signal.

26. The method of claim 25, wherein when the power conversion unit comprises a voltage source inverter, the step of receiving and converting the d-axis given current signal and the q-axis given current signal to the three-phase command signal by the first coordinate transformation further comprises:
   generating a d-axis voltage command signal corresponding to the d-axis given current signal and a q-axis voltage command signal corresponding to the q-axis given current signal; and
   receiving and converting the d-axis voltage command signal and the q-axis voltage command signal to a three-phase command signal by the first coordinate transformation.

27. The method of claim 26, wherein the three-phase feedback signal, the d-axis feedback signal and the q-axis feedback signal are all current signals.

28. The method of claim 25, wherein the power conversion unit comprises a current source inverter, and the three-phase feedback signal, the d-axis feedback signal and the q-axis feedback signal are all voltage signals.

29. The method of claim 25, wherein when a value of the d-axis inductance is calculated, the d-axis given current signal comprises a DC component and an AC component.

30. The method of claim 29, wherein the q-axis given current signal is zero.

31. The method of claim 29, wherein when a value of the d-axis inductance is calculated, the d-axis given current signal comprises a DC component and an AC component, and when the amplitude of the DC component of the d-axis given current signal is constant and the amplitude of the AC component of the d-axis given current signal changes, different d-axis inductances corresponding to the AC component form a successive d-axis inductance curve.

32. The method of claim 29, wherein when a value of the d-axis inductance is calculated, the d-axis given current signal comprises a DC component and an AC component, and when the amplitude of the DC component of the d-axis given current signal changes, the DC component with different amplitude corresponds to different d-axis inductance curves.

33. The method of claim 25, wherein when a value of the q-axis inductance is calculated, the q-axis given current signal comprises an AC component and the d-axis given current signal comprises a DC component.

34. The method of claim 25, wherein when a value of the d-axis inductance is calculated, the d-axis given current signal comprises a DC component and an AC component; and when a value of the q-axis inductance is calculated, the d-axis given current signal comprises a DC component and the q-axis given current signal comprises an AC component,
   wherein, the waveform of the AC component of the d-axis given current signal and/or the q-axis given current signal is a sine wave, triangular wave or saw-tooth wave.

35. The method of claim 25, wherein when a value of the d-axis inductance is calculated, the d-axis given current signal comprises a DC component and an AC component; and when a value of the q-axis inductance is calculated, the d-axis given current signal comprises a DC component and the q-axis given current signal comprises an AC component,
   wherein, the frequency of the AC component of the d-axis given current signal and/or the q-axis given current signal is 0.5-3 times of the rated frequency of the permanent motor.

36. The method of claim 35, wherein the frequency of the AC component of the d-axis given current signal and/or the q-axis given current signal is equal to the rated frequency of the permanent motor.

37. The method of claim 33, wherein when a value of the q-axis inductance is calculated, the d-axis given current signal comprises a DC component and the q-axis given current signal comprises an AC component, and when the amplitude of the DC component of the d-axis given current signal is constant and the amplitude of the AC component of the q-axis given current signal changes, different q-axis inductances corresponding to the AC component form a successive q-axis inductance curve.

38. The method of claim 33, wherein when a value of the q-axis inductance is calculated, the d-axis given current signal comprises a DC component and the q-axis given current signal comprises an AC component, and when the amplitude of the DC component of the d-axis given current signal changes, the DC component with different amplitude corresponds to different q-axis inductance curves.

* * * * *